US009215823B2

(12) United States Patent
Kaneko et al.

(10) Patent No.: US 9,215,823 B2
(45) Date of Patent: Dec. 15, 2015

(54) ELECTRONIC CONTROL APPARATUS (71) Applicant: HITACHI AUTOMOTIVE SYSTEMS, LTD., Hitachinaka-shi, Ibaraki (JP)

(72) Inventors: Susumu Kaneko, Isesaki (JP); Kazuaki Nagashima, Kiryu (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 312 days.

(21) Appl. No.: 13/852,563

(22) Filed: Mar. 28, 2013

(65) Prior Publication Data
US 2013/0286563 A1 Oct. 31, 2013

(30) Foreign Application Priority Data

Apr. 25, 2012 (JP) ................................. 2012-099399

(51) Int. Cl.
*H05K 7/00* (2006.01)
*B60T 8/36* (2006.01)

(52) U.S. Cl.
CPC .. *H05K 7/00* (2013.01); *B60T 8/368* (2013.01)

(58) Field of Classification Search
USPC .......... 361/728–730, 796, 800; 303/139, 140, 303/146
See application file for complete search history.

(56) References Cited

U.S. PATENT DOCUMENTS

| 7,720,589 | B2 | 5/2010 | Hashiba | |
| 2006/0125314 | A1 | 6/2006 | Hashiba | |
| 2007/0230143 | A1* | 10/2007 | Inagaki | 361/752 |
| 2008/0036292 | A1 | 2/2008 | Sakai et al. | |
| 2008/0121292 | A1* | 5/2008 | Tsuruta | 137/576 |

FOREIGN PATENT DOCUMENTS

| JP | 2006-168408 A | 6/2006 |
| JP | 2008-062915 A | 3/2008 |

* cited by examiner

*Primary Examiner* — Hung S Bui
(74) *Attorney, Agent, or Firm* — Foley & Lardner LLP

(57) ABSTRACT

A busbar member is a unit to be connect with a hydraulic unit. The busbar member includes a base portion, and a surrounding wall which defines a receiving portion formed between the hydraulic unit and the base portion and which is arranged to receive a control section to control the hydraulic unit. The busbar member further includes a connector supporting portion which is formed integrally with the base portion, which projects from the base portion in a form of a cantilever and which is arranged to support a connector, and a bulging portion which is arranged to receive a component of the control section, which projects from the connector supporting portion and which is connected with the surrounding wall.

8 Claims, 5 Drawing Sheets

ELECTRONIC CONTROL APPARATUS

BACKGROUND OF THE INVENTION

The present invention relates to an electronic control apparatus and more specifically to a cantilever supporting structure.

A Japanese patent document JP 2006-168408A (corresponding to US 2006/0125314A1 Hashiba) shows an electronic control apparatus. As shown in FIG. 1 of this document, a (resin) casing (20) includes a base portion joined with a housing (10) and a mounting portion (20b) projecting from the base portion and including a mounting surface (20b) supporting a waterproof connector assembly (24) including a power source connector (24a) for a power source and a control connector (24b), and a bulge (25) encasing a vehicle behavior sensor (S).

SUMMARY OF THE INVENTION

However, in the electronic control apparatus of the above-mentioned patent document, the mounting portion (20b) projects from the housing 10 in the form like a cantilever beam. Therefore, the mounting portion is liable to vibrate and affect the sensing accuracy of the vehicle behavior sensor (S) adversely.

Therefore, it is an object of the present invention to provide an electronic control apparatus or a supporting structure for restraining undesired vibrations.

According to one aspect of the present invention, an electronic control apparatus or a supporting structure thereof comprises a busbar member to be connect with a hydraulic unit, the busbar member including a base portion or base board, a surrounding wall which defines a receiving portion formed between the hydraulic unit and the base portion and which is arranged to receive a control section to control the hydraulic unit, a connector supporting portion which is formed integrally with the base portion, which projects from the base portion in a form of a cantilever and which is arranged to support a connector, and a bulging portion which is arranged to receive a component of the control section, which projects from the connector supporting portion and which is connected with the surrounding wall.

DETAILED DESCRIPTION OF THE INVENTION

FIGS. 1~5 show an electronic control apparatus according to one embodiment of the present invention.

In a brake system for a motor vehicle, a brake pedal is connected with a first piston provided in a first cylinder having a smaller cross sectional area, and the first cylinder filled with a hydraulic fluid or oil is connected with a second cylinder having a greater cross sectional area. A second piston provided in the second cylinder is connected with a brake booster. The second cylinder is connected with a wheel brake actuator of each wheel of the vehicle, through an ABS device (anti-lock-brake-system) for preventing tire lock, and/or a VDC device (vehicle dynamics control) for controlling the attitude of the vehicle in case of side slip etc., in this example.

In this embodiment, the present invention is applied to the electronic control apparatus for controlling the ABS device.

The ABS system in this example includes the master cylinder to produce a brake fluid pressure in accordance with a depression quantity of the brake pedal of the vehicle, a main passage connecting the master cylinder with a wheel cylinder of at least one wheel of the vehicle, a pressure increase valve which is provided in the main passage as a solenoid valve or electromagnetic valve for controlling the brake fluid pressure and which is a normally-open solenoid valve in this example, a pressure decrease valve which is provided in the main passage as a solenoid valve for controlling the brake fluid pressure and which is a normally-closed solenoid valve, a plunger pump provided in the main passage and arranged to discharge the brake pressure toward the wheel cylinder, and a reservoir tank to store the brake fluid discharged from the wheel cylinder through the pressure decrease valve, and to supply the brake fluid to the main passage with the operation of the plunger pump.

The pressure increase valve is controlled to supply the brake pressure from the master cylinder to the wheel cylinder at the time of brake operation. The pressure decrease valve is controlled to return the brake fluid to the reservoir tank by being opened when the pressure of the wheel cylinder becomes higher than or equal to a predetermined level and a wheel slip is produced.

The opening and closing operations of the pressure increase valve and pressure decrease valve are performed by energization and deenergization in accordance with control signals from the electronic control apparatus. The brake pressure of the wheel cylinder or each wheel cylinder is increased/decreased or held by the opening and closing operations of the pressure increase valve.

Figure 2:
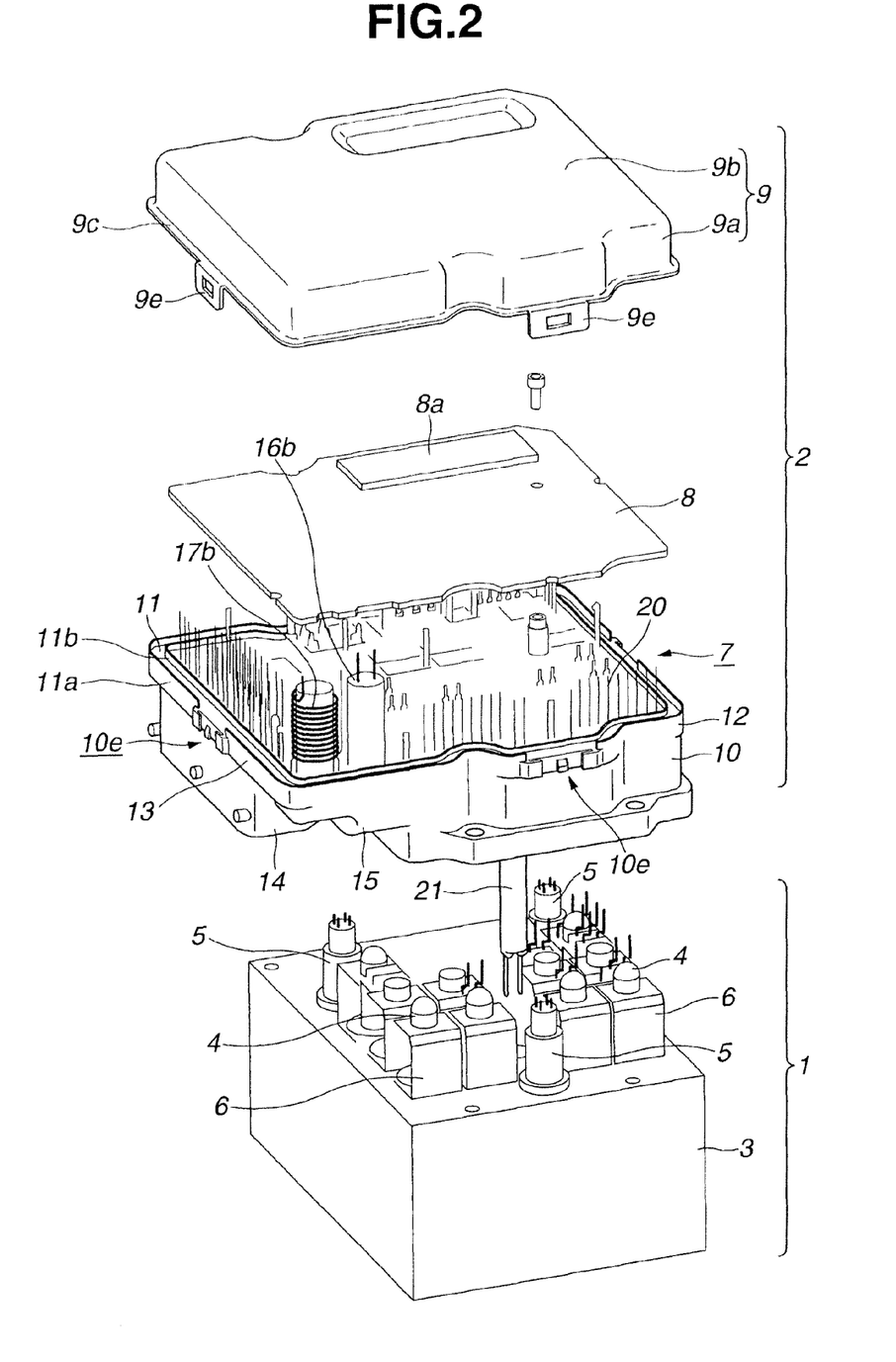
FIG. 2 is an exploded perspective view of the electronic control apparatus of FIGS. 1A and 1B.

FIG. 2 shows a setup or assembly including a hydraulic unit 1 including the pressure increase valve and pressure decreasing valve, and an electronic control unit 2 for controlling the hydraulic unit 1.

The hydraulic unit 1 is shown in FIG. 2 below electronic control unit 2. Hydraulic unit 1 includes a block 3 which is made of an aluminum alloy in this example and which has an upper surface formed with receiving holes, a plurality of solenoid valves 4 received in the receiving holes, for serving as the pressure increase and decrease valves, and one or more fluid pressure sensors 5 received in the receiving holes. Block 1 is formed with main and sub passages connected with solenoid valves 4. The main passage is provided with a plunger pump (not shown) for supplying a brake fluid pressure, and an electric motor (not shown) for driving the plunger pump.

The electronic control unit 2 shown in FIG. 2 above hydraulic unit 1 includes a busbar member 7, a printed circuit board 8 and a cover 9 which is a metallic cover in this example.

Figure 1A:
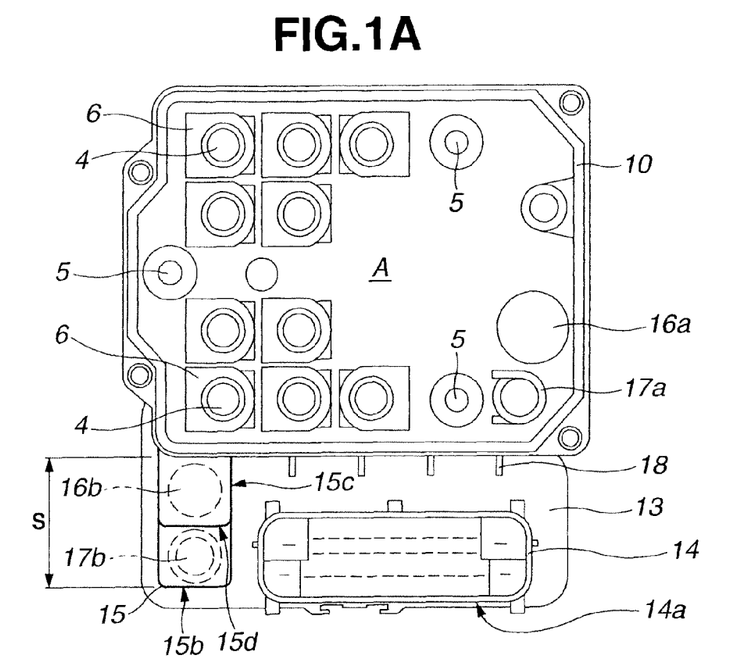
FIG. 1A is a plan view showing an electronic control apparatus according to one embodiment of the present invention.
Figure 1B:
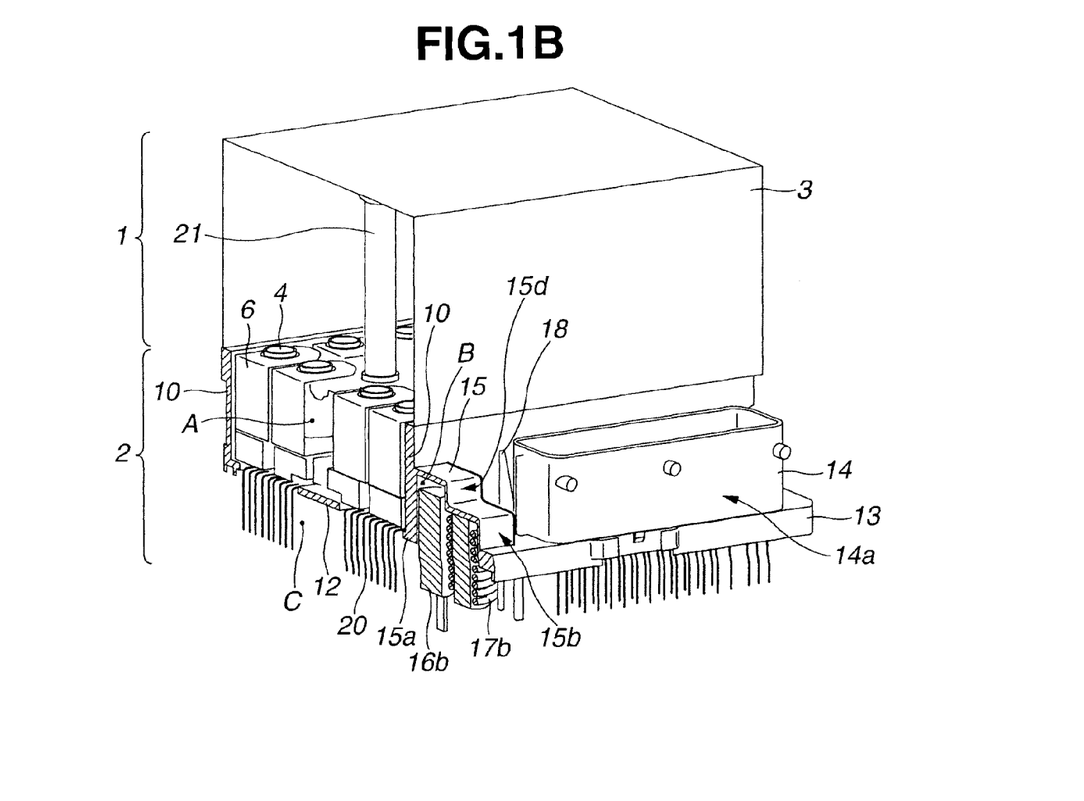
FIG. 1B is a perspective view of the electronic control apparatus of FIG. 1A.
Figure 4:
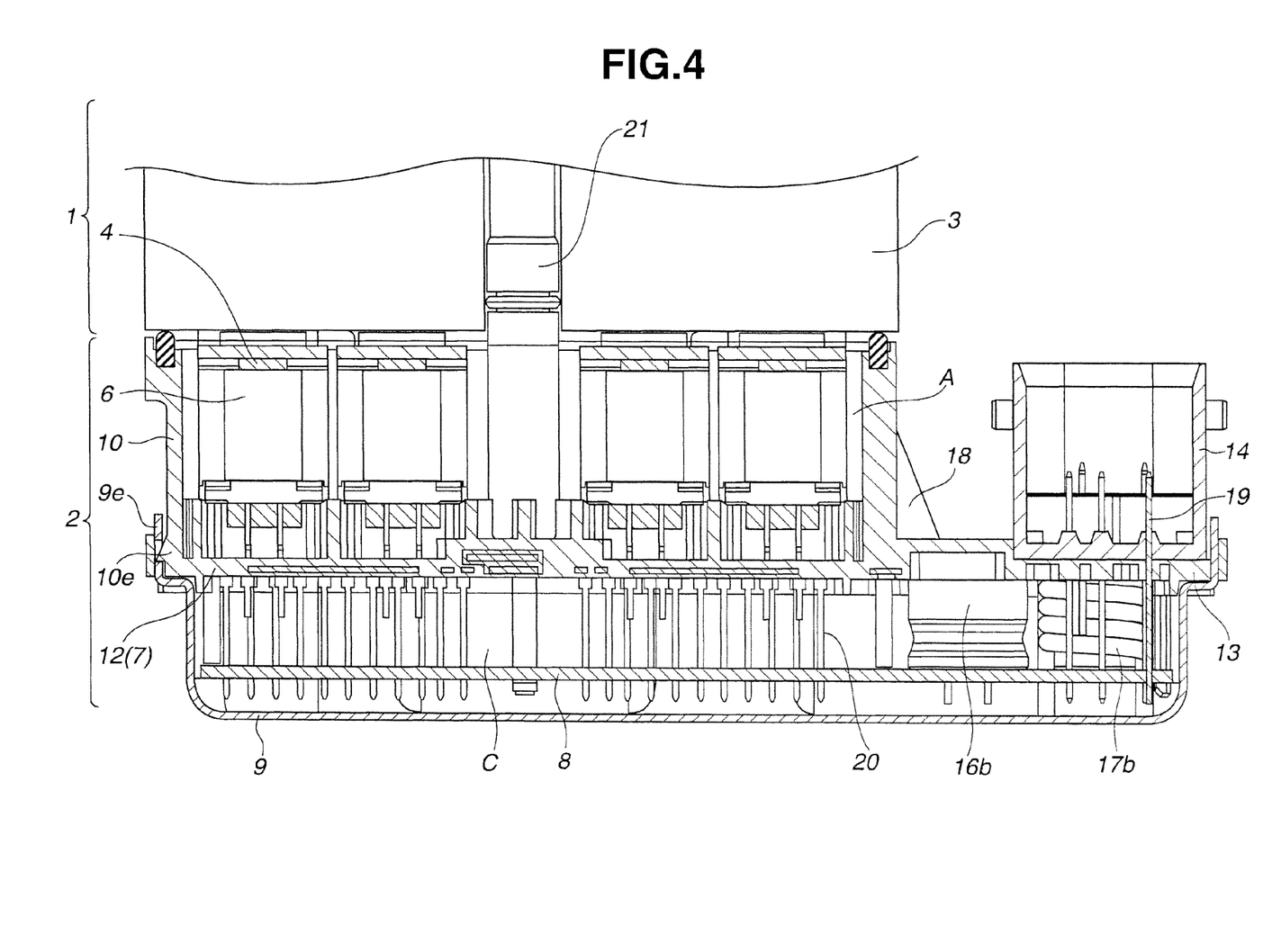
FIG. 4 is a sectional view of the electronic control apparatus of FIGS. 1A and 1B.

In a perspective view of FIG. 1B and a sectional view of FIG. 4, the busbar member or busbar body 7 is shown in the inverted state in which the assembly of hydraulic unit 1 and electronic control unit 2 is turned upside down. Busbar member 7 of electronic control unit 2 is joined to hydraulic unit 1. As shown in FIG. 1B, busbar member 7 includes a base portion or base board or busbar main portion 12 (including at least one busbar), and a surrounding wall 10. The surrounding wall 10 is formed on a hydraulic unit's side of base portion 12. Surrounding wall 10 extends so as to describe a rectangle, and thereby defines a first receiving portion (chamber) A receiving a control section or device or control means for controlling hydraulic unit 1. As a component of the control section or means, there are provided one or more coil units 6 to operate or open/close the solenoid valves 4 of hydraulic unit 1. Each or the coil unit 6 is disposed in the first receiving portion A in the state in which one solenid valve 4 is inserted. Surrounding wall 10 stands or projects upright from the base portion or board 12 toward hydraulic unit 1, and thereby define the first receiving portion A formed between hydraulic unit 1 and base portion 12.

A power electronic circuit is provided in the printed circuit board 8 which is disposed in a later-mentioned third receiving portion (chamber) C. The power electronic circuit is a circuit to produce a switching signal for opening and closing operations of each solenoid valve 4 and to supply electric power to a stator of the electric motor (not shown) in the block 3.

A connector supporting portion 13 is formed integrally with the base portion 12 as shown in FIGS. 1B and 4, and arranged to support a connector 14 (or a connector section or connector assembly). Connector supporting portion 13 is shaped like a rectangular plate. As shown in FIG. 4, the plate-shaped connector supporting portion 13 projects rightwards in FIG. 4 from the base portion 12 which is shaped like a plate or board. As viewed in FIG. 4, the plate-shaped base portion 12 of busbar member 7 extends substantially in an imaginary horizontal plane (as viewed in FIG. 4), and the connector supporting portion 13 also extends substantially in the imaginary horizontal plane like an extension of the base portion 12. The connector supporting portion 13 projects (laterally) from base portion 12 so that the connector supporting portion 13 is supported at one end like a cantilever. The connector 14 is formed so that connector 14 projects (vertically as viewed in FIG. 4) toward the hydraulic unit's side (the upper side as viewed in FIG. 4).

A bulging portion 15 projects from the connector supporting portion 13, and defines a second receiving portion (chamber) B to receive a component or components of the control section or means. From the connector supporting portion 13, the bulging portion 15 projects in the same direction as the connector 14. In the illustrated example, the bulging portion 15 is stepped to have a stepped form of two steps to cover two components of different heights to be disposed in the second receiving portion B.

Bulging portion 15 is connected or joined with the surrounding wall 10 of the first receiving portion A. As shown in 1B, the bulging portion 15 includes a first wall 15a connected with the surrounding wall 10 and joined integrally with the surrounding wall 10 so as to form an integral wall, and a second wall 15b opposite to the first wall 15a. The connector 14 supported by the connector supporting portion 13 includes a first wall confronting the surrounding wall 10 and a second wall 14a opposing the first wall of connector 14. The second wall 15b of the bulging portion 15 is located at a position near the position of the second wall 14a of the connector 14. As shown in FIG. 1A, a total or overall length S of bulging portion 15 is approximately equal to (or slightly smaller than or equal to) a distance of the second wall 14a of connector 14 from the surrounding wall 10.

The first wall 15a of bulging portion 15 is joined, and formed integrally, with surround wall 10. Therefore, a side wall 15c of bulging portion 15 is connected integrally and continuously with the surrounding wall 10. Bulging portion 15 projects from the surrounding wall 10 to a position at the side of connector 15. In the illustrated example, the bulging portion 15 projects from the connector supporting portion 13 (in a perpendicular direction or second direction) toward the position of hydraulic unit 1. Connector 14 also projects from the connector supporting portion 13 (in the perpendicular direction) toward the position of hydraulic unit 1. There is formed a space between bulging portion 15 and connector 14, and the bulging portion 15 is not connected directly with the connector 14 in the example shown in FIGS. 1A and 1B.

One or more reinforcing ribs 18 are formed between the connector supporting portion 13 and surrounding wall 10, to restrain flexural or bending vibrations of connector supporting portion 13 with respect to base portion 12. In the illustrated example, there are four of the reinforcing ribs 18. Each reinforcing rib 18 is triangular (in the form of a right triangle in this example shown in FIG. 4). As shown in FIG. 4, each of the triangular reinforcing ribs 18 includes a first side extending in a first (lateral) direction which is a horizontal direction as viewed in FIG. 4) and a second side extending in a second (perpendicular) direction perpendicular to the first (lateral) direction. The laterally or horizontally extending (shorter) first side of each of the triangular reinforcing ribs 18 is joined with (the horizontal surface of) of connector supporting portion 13, and the perpendicularly or vertically extending (longer) second side of each of the triangular reinforcing ribs 18 is joined with (the vertical surface of) the surrounding wall 10.

The cover 9 is provided on the opposite side of base portion 12 opposite to surrounding wall 10. Base portion or base board 12 includes a first surface facing toward hydraulic unit 1 and a second surface opposite to the first surface. Surrounding wall 10 projects upright from the first surface of base portion 12. Cover 9 is attached to base portion 12 to cover (the second surface of) the base portion 12 and the connector supporting portion 13, as best shown in FIG. 4. The third receiving portion (or chamber) C is formed between the cover 9 and the base portion 12 and connector supporting portion 13. The printed circuit board 8 is disposed in the third receiving portion C.

As shown in FIG. 2, cover 9 includes a brim or outer peripheral portion 9a and a plate-shaped portion 9b closing one end side of the brim 9a. Brim 9a projects from the outer periphery of plate-shaped portion 9b, to an outward flange 9c projecting outwards. In this example, the cover 9 is made of metallic material to ensure the heat radiating or dissipating property and noise proof property.

The approximately plate-shaped integral unit of base portion 12 and connector supporting portion 13 includes an outer peripheral projection 11a fringing the integral unit of base portion 12 and connector supporting portion 13, and an inner ridge projection 11b on the inner side of the outer peripheral projection 11a. A seal surface 11 is formed between the outer peripheral projection 11a and the inner ridge projection 11b. The outward flange 9c of cover 9 is inserted in a groove between the outer peripheral projection 9a and the inner ridge projection 9b both projecting toward cover 9. The lower surface of outward flange 9c of cover 9 abuts on the seal surface 11 facing toward cover 9.

Cover 9 includes engaging portions 9e projecting from the projecting end of the outer flange 9c, toward busbar member 7. On the other hand, busbar member 7 includes engaging portions 10e arranged to engage, respectively, with the engaging portions 9e to hold the cover 9 so as to prevent cover 9 from being removed from busbar member 7.

The printed circuit board 8 is provided with at least one semiconductor switching device (MOS-FET) (not shown) configured to control the drive of the inverter, as a component of the power electronic circuit for supplying electric power to the electric motor. As shown in FIG. 4, the printed circuit board 8 is connected, through a solder joint portion, with a connection terminal 20 provided in in the base portion 12. The connection terminal 20 is connected with the electric motor through a motor connector 21 standing upright from the base portion 12. A thermal conductive sheet 8a for heat dissipation is attached with adhesive to printed circuit board 8.

As shown in FIG. 2, the connector 14 and the motor connector 21 project from the integral unit of busbar base portion 12 and connector supporting portion 13. From the integral unit of busbar base portion 12 and connector supporting portion 13, a plurality of terminals project toward the third receiving portion C, such as terminals connected with a signal connector (not shown) and terminals for control signals to drive a motor relay and the semiconductor switching device (FET). These terminals are connected with printed circuit board 8.

Moreover, as shown in FIG. 4, at least one connection terminal 19 is provided in printed circuit board 8. This connection terminal 19 projects upwards in FIG. 4, to a projecting (upper) end portion which is inserted in the connector 14 supported by the connector supporting portion 13. Electric power is supplied from connector 14 through the connection terminal 19, to the power electric circuit of printed circuit board 8, and further supplied to the electric motor and solenoid valves 4.

Figure 3A:
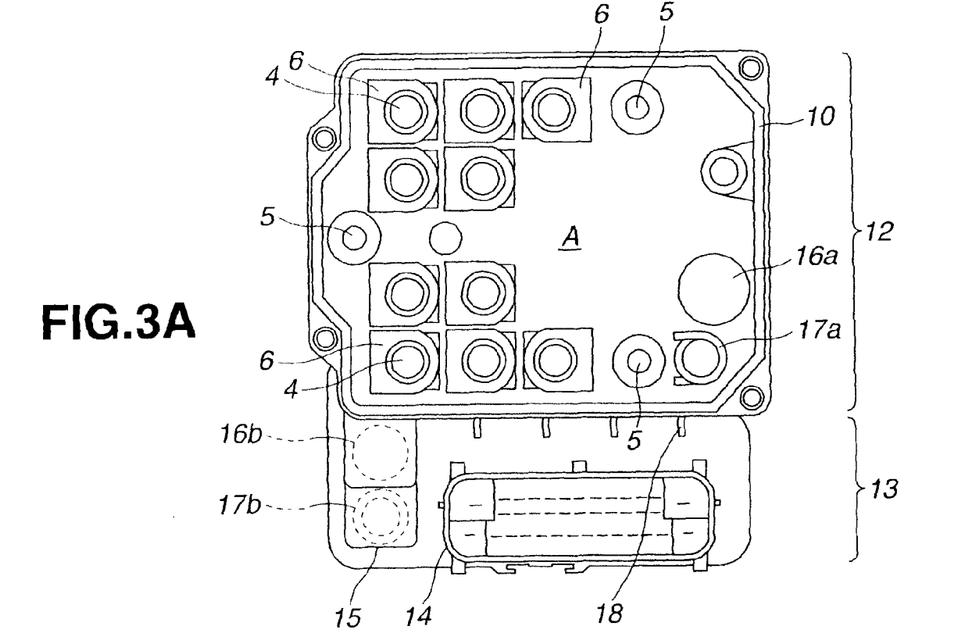
FIG. 3A is a plan view of a busbar member of the electronic control apparatus of FIGS. 1A and 1B.
Figure 3B:
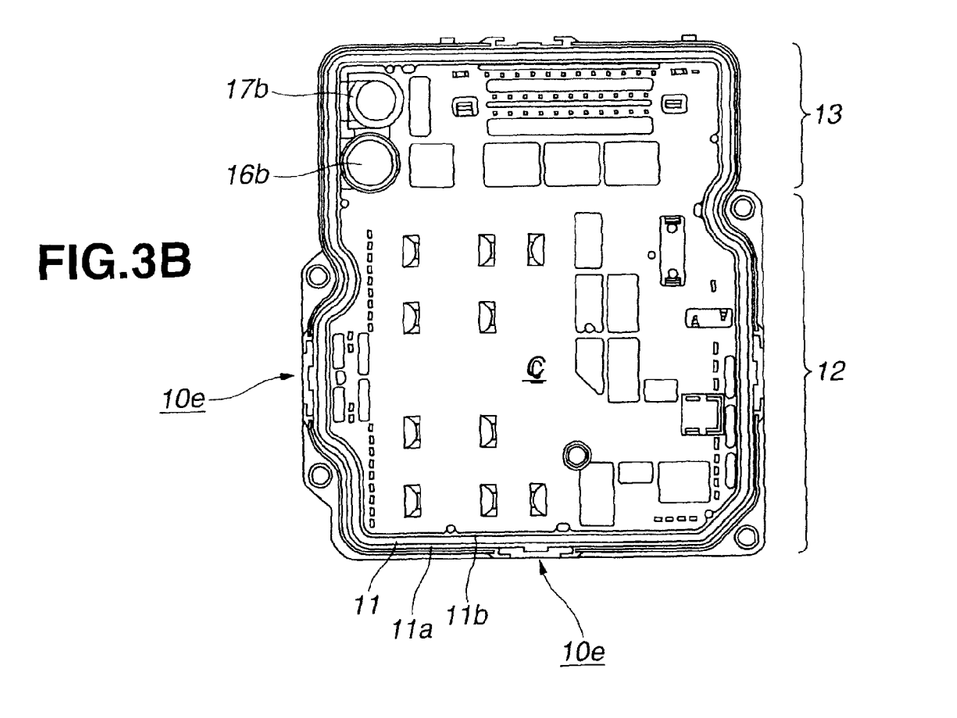
FIG. 3B is a bottom view of the busbar member of FIG. 3A.

FIG. 3A shows the upper surface (facing the first receiving portion A) of busbar base portion 12 shown in FIG. 1B, and FIG. 3B shows the lower surface (facing the third receiving portion C) of busbar base portion 12 shown in FIG. 1B. As shown in FIG. 1A, an aluminum electrolytic capacitor 16a and a coil 17a are disposed in the first receiving portion A. Furthermore, in the third receiving portion C and the second receiving portion B, there are provided an aluminum electrolytic capacitor 16b and a coil 17b to form an electromagnetic filter circuit for reducing electromagnetic noise. Moreover, there are further provided a common coil (not shown) and a ceramic capacitor (not shown).

Figure 5A:
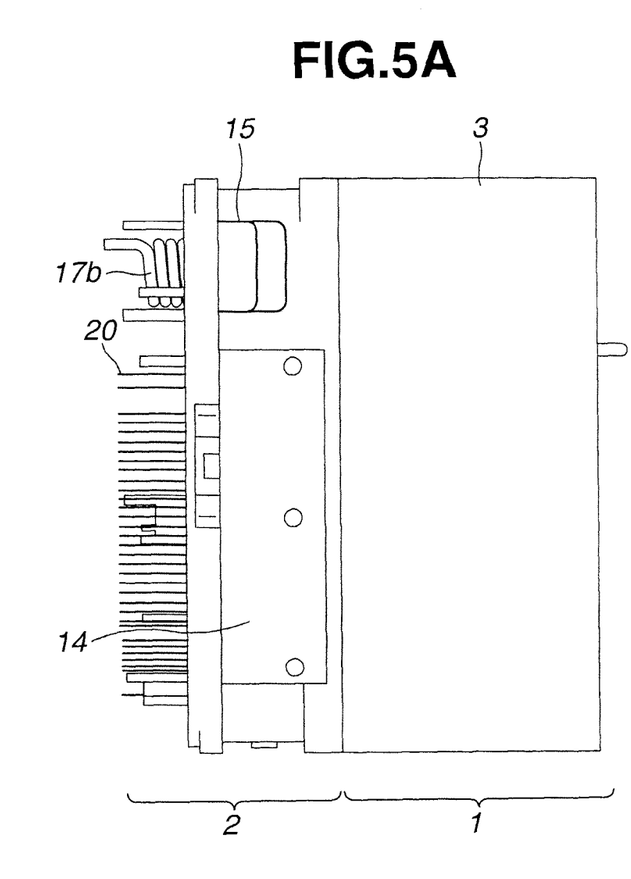
FIG. 5A is a (left) side view of the electronic control apparatus of FIGS. 1A and 1B in an installed state or position installed in a vehicle.
Figure 5B:
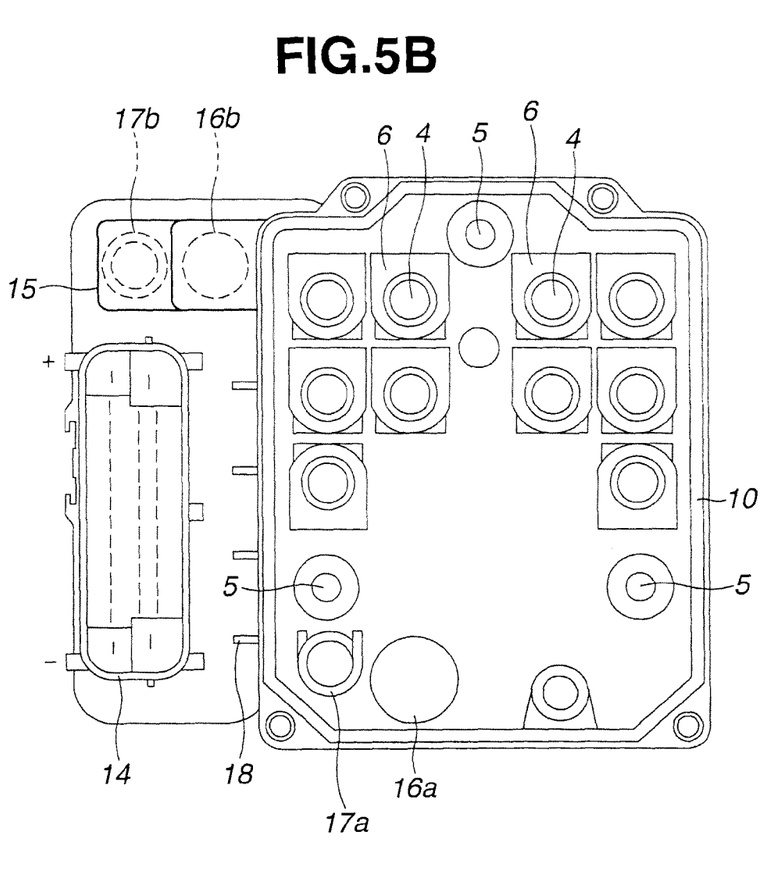
FIG. 5B is a front view of the electronic control apparatus of FIGS. 1A and 1B in the installed state.

FIGS. 5A and 5B show the hydraulic unit 1 and electronic control unit 2 in the state in which these units 1 and 2 are installed in a vehicle body. The connection terminals 19 are inserted in the connector 14 as shown in FIG. 4, and arranged so that the plus connection terminal 19 is located at an upper position in the vertical direction in the installed state of FIG. 5B. The minus connection terminal is located below the plus connection terminal. Moreover, the second receiving portion B defined by the bulging portion 15 is located above the connector 14 in the vertical direction in the installed state.

As shown in FIG. 5B, the reinforcing ribs 18 are formed between connector 14 and the surrounding wall 10. As shown in FIG. 4, a part of the printed circuit board 8 is located under the base portion 12, and a part of printed circuit board 8 is located under the connector supporting portion 13. The third receiving portion C extends from a potion under the base portion 12 to a portion under the connector supporting portion 13. A component (such as the capacitor 16b and coil 17b) extends upwards (as viewed in FIG. 1B) from the third receiving portion C to the second receiving portion B in the bulging portion 15, as shown in FIG. 1B.

The electronic control apparatus according to this embodiment is operated as follows.

The connector supporting portion 13 supported only at one end like a cantilever beam is connected with the surrounding wall 10 by the bulging portion 15. Therefore, the cantilever connector supporting portion 13 is reinforced by the bulging portion 15 so as to restrain vibrations of the cantilever connector supporting portion 13.

By restraining vibrations of the connector supporting portion 13, the supporting structure according to this embodiment can restrain bending of connector supporting portion 13, and thereby restrain angular deviation of the connector 14 supported by the connector supporting portion 13 due to deflection of connector supporting portion 13.

In a conventional arrangement in which the bulging portion 15 is not connected with the surrounding wall 10, the connector supporting portion 13 might bend with respect to the base portion 12 immediately after resin molding, and the angle of the connector 14 might be changed from the correct angle. By contrast, the supporting structure according to this embodiment can restrain bending of the connector supporting portion 13 with the bulging portion 15 joined with the surrounding wall 10, and thereby hold the connector 14 at the correct angle substantially equal to a right angle, relative to the base portion 12.

The bulging portion 15 is formed by utilizing a dead space to increase the space for mounting electronic components. This bulging portion 15 is connected with the surrounding wall 10 and thereby further utilized for reducing vibrations of the connector supporting portion 13.

The bulging portion 15 is extended from the surrounding wall 10 as long as possible so that the length S of bulging portion 15 from the surrounding wall 10 is set to a length approximately equal to a maximum. The thus-formed bulging portion 15 can reinforce the connector supporting portion 13 over a longer distance almost reaching the free end of the cantilever supporting portion 13, and reduce vibrations of the connector supporting portion 13 effectively. In the illustrated example, the bulging portion 15 extends in the first direction (downwards in FIGS. 1A, 3A and 5A) beyond the position of the first wall of connector 14 which is a wall closer to the surrounding wall 10, to an end (15b) which is located between the position of the first wall of connector 14 and the position of the second wall of connector 14 which is opposite to the first wall and remoter from the surrounding wall 10.

This supporting structure including the bulging portion 15 connected with the surrounding wall 10 can restrain vibrations of the connector supporting portion 13 effectively and thereby prevent a decrease of the sensing accuracy of a vehicle behavior sensor for sensing vibrations.

In the illustrated example, the minus terminal of the battery of the vehicle is grounded to the body, and the plus connection terminal 19 is disposed at an upper position in the connector 14. This arrangement can lower the possibility of the plus connection terminal being immersed in water entering the connector 14, and thereby lower the possibility of short-circuit. Moreover, the noise removing component such as the aluminum electrolytic capacitor 16b and coil 17b can perform function of removing noises at a position closer to the plus connection terminal 19, and thereby remove noises efficiently.

By restraining vibrations of connector supporting portion 13 and bulging portion 15, the supporting structure according to this embodiment can protect the printed circuit board 8 and solder joint portions, against degradation due to vibrations transmitted to the nose removing component such as the aluminum electrolytic capacitor 16b and coil 17b.

In this embodiment, the supporting structure can restrain vibrations of connector supporting portion 13 and thereby reduce vibrations transmitted to the printed circuit board 8 in the third receiving portion C. Therefore, the supporting structure can reduce vibrations transmitted to the solder joint portion between printed circuit board 8 and the connection terminal 20 of the busbar base portion 12, and thereby reduce stress in the solder joint portion. Furthermore, this supporting structure can restrain warp or bending of connector supporting portion 13 and thereby restrain warp or bending of the sealing surface 11 extending around the base portion 12 and connector supporting portion 13 as best shown in FIG. 3B and FIG. 2. Therefore, this supporting structure can make uniform the contact between cover 9 and the sealing surface 11 over the entire area, and thereby improve the sealing performance between sealing surface 11 and cover 9.

In the illustrated example, the bulging portion 15 projects (in the first direction which is the downward direction in FIG. 1A) from the base end of bulging portion 15 joined (integrally) with the surrounding wall 10 to the end surface 15*b* of bulging portion 15. The end surface 15*b* of bulging portion 15 is located at or near the position of the outside surface of outer wall 14*a* of connector 14 opposite to the inner wall confronting the surrounding wall 10. The projecting length of bulging portion 15 (as measured in the first direction) from the surrounding wall 10 is approximately equal to, or slightly smaller than the distance of the outside surface of outer wall 14*a* of connector 14 from the surrounding wall 10. The side wall 15*c* of bulging portion 15 extends in the first direction along a joint line along which the side wall 15*c* and connector supporting portion 13 are joined together over the whole length S so as to form an angled corner, and extends in the second direction perpendicular to the first direction along a joint line along which the side wall 15*c* and surrounding wall 10 are joint together so as to form an angled corner.

It is optional to decrease the projecting length of bulging portion 15 to a value smaller than S shown in FIG. 1A. For example, the projecting length of bulging portion 15 may be set equal to a distance of a step 15*d* of bulging portion 15, from the surrounding wall 10 shown in FIGS. 1A and 1B.

In the installed state of the electronic control apparatus installed in the vehicle, as shown in FIG. 5, the plus connection terminal 19 is disposed above the minus connection terminal, the noise removing component (16*b*, 17*b*) is provided in the second receiving portion B defined by bulging portion 15, and the second receiving portion B is located above the connector 14, However, the present invention is not limited to this arrangement. Moreover, the sealing surface 11 is formed so as to extend over the base portion 12 and connector supporting portion 13, and the printed circuit board 8 is disposed in the third receiving portion C formed by cover 9 abutting on the sealing surface 11. However, the present invention is not limited to this arrangement.

In the illustrated example, the bulging portion 15 includes a covering wall extending from a first end joined (integrally) with the surrounding wall 10 to form an angled corner therebetween, to a second end (15*b*) joined (integrally) with the connector supporting portion 13 to form an angled corner therebetween, along a lateral edge joined (integrally) with the side wall 15*c* to form an angled corner therebetween. In the illustrated example, the covering wall of the bulging portion 15 includes the step 15*d*. Accordingly, the covering wall of bulging portion 15 includes a first tread wall extending in the first direction from surrounding wall 10, a first riser wall (15*d*) extending in the second direction from the end of the first tread wall, and a second tread wall extending from the end of the first riser wall in the first direction, and a second riser wall or end wall (15*b*) extending in the second direction from the end of the second tread wall so as to form a flight of stairs.

This application is based on a prior Japanese Patent Application No. 2012-99399 filed on Apr. 25, 2012. The entire contents of this Japanese Patent Application are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. An electronic control apparatus comprising:
    a busbar member to be connected with a hydraulic unit, the busbar member including
        a base portion,
        a surrounding wall which defines a receiving portion formed between the hydraulic unit and the base portion and which is arranged to receive a control section to control the hydraulic unit,
        a connector supporting portion which is formed integrally with the base portion, which projects from the base portion in a form of a cantilever and which is arranged to support a connector, and
        a bulging portion which is arranged to receive a component of the control section, which projects from the connector supporting portion and which is connected with the surrounding wall,
    wherein, in an installed state in which the electronic control apparatus is installed in a vehicle, a positive connection terminal is disposed in an upper portion of the connector, a noise reducing component is provided in the bulging portion, and the bulging portion is located above the connector.

2. The electronic control apparatus as recited in claim 1, wherein the connector supported by the connector supporting portion includes a first wall confronting the surrounding wall and a second wall opposite to the first wall, and the bulging portion includes a first wall connected with the surrounding wall and a second wall opposite to the first wall, the second wall of the bulging portion being located at a position near a position of the second wall of the connector.

3. The electronic control apparatus as recited in claim 1, wherein the base portion spreads in a first direction along a printed circuit board, the connector supporting portion projects in the first direction continuously from the base portion, from a base end supported by the base portion to a free end, the connector projects in a second direction substantially perpendicular to the first direction, from the connector supporting portion, the bulging portion projects in the second direction from the base portion, and the surrounding wall includes a wall section which projects in the second direction from the connector supporting portion, which confronts the connector across a space formed between the wall section and the connector, and which is connected with the bulging portion.

4. The electronic control apparatus as recited in claim 3, wherein the bulging portion includes a side wall which projects in the first direction from the wall section of the surrounding wall, which projects in the second direction from the connector supporting portion and which confronts the connector across a space formed between the bulging portion and the connector.

5. The electronic control apparatus as recited in claim 1, wherein the busbar member includes a seal surface extending over the base portion and the connector supporting portion, and the electronic control apparatus further comprises a cover abutting on the seal surface of the busbar member and defining a receiving portion in which a printed circuit board is disposed, the base portion being located between the receiving portion defined by the cover and the receiving portion defined by the surrounding wall.

6. An electronic control apparatus, comprising:
a busbar member to be connected with a hydraulic unit, the busbar member including
a base portion,
a surrounding wall which defines a receiving portion formed between the hydraulic unit and the base portion and which is arranged to receive a control section to control the hydraulic unit,
a connector supporting portion which is formed integrally with the base portion, which projects from the base portion in a form of a cantilever and which is arranged to support a connector, and
a bulging portion which is arranged to receive a component of the control section, which projects from the connector supporting portion and which is connected with the surrounding wall;
wherein the base portion spreads in a first direction along a printed circuit board, the connector supporting portion projects in the first direction continuously from the base portion, from a base end supported by the base portion to a free end, the connector projects in a second direction substantially perpendicular to the first direction, from the connector supporting portion, the bulging portion projects in the second direction from the base portion, and the surrounding wall includes a wall section which projects in the second direction from the connector supporting portion, which confronts the connector across a space formed between the wall section and the connector, and which is connected with the bulging portion;
wherein the bulging portion includes a side wall which projects in the first direction from the wall section of the surrounding wall, which projects in the second direction from the connector supporting portion and which confronts the connector across a space formed between the bulging portion and the connector; and
wherein the connector supporting portion projects in the first direction from the wall section of the surrounding wall and forms an angled corner with the wall section, and the angled corner is reinforced by a reinforcing rib which is located between the wall section and the connector.

7. An electronic control apparatus, comprising:
a busbar member to be connected with a hydraulic unit, the busbar member including
a base portion,
a surrounding wall which defines a receiving portion formed between the hydraulic unit and the base portion and which is arranged to receive a control section to control the hydraulic unit,
a connector supporting portion which is formed integrally with the base portion, which projects from the base portion in a form of a cantilever and which is arranged to support a connector, and
a bulging portion which is arranged to receive a component of the control section, which projects from the connector supporting portion and which is connected with the surrounding wall;
wherein the base portion spreads in a first direction along a printed circuit board, the connector supporting portion projects in the first direction continuously from the base portion, from a base end supported by the base portion to a free end, the connector projects in a second direction substantially perpendicular to the first direction, from the connector supporting portion, the bulging portion projects in the second direction from the base portion, and the surrounding wall includes a wall section which projects in the second direction from the connector supporting portion, which confronts the connector across a space formed between the wall section and the connector, and which is connected with the bulging portion;
wherein the bulging portion includes a side wall which projects in the first direction from the wall section of the surrounding wall, which projects in the second direction from the connector supporting portion and which confronts the connector across a space formed between the bulging portion and the connector; and
wherein the bulging portion includes a covering wall extending from a first end joined with the surrounding wall to form an angled corner therebetween, to a second end joined with the connector supporting portion to form an angled corner therebetween, along a lateral edge joined with the side wall to form an angled corner therebetween.

8. An electronic control apparatus, comprising:
a busbar member to be connected with a hydraulic unit, the busbar member including
a base portion,
a surrounding wall which defines a receiving portion formed between the hydraulic unit and the base portion and which is arranged to receive a control section to control the hydraulic unit,
a connector supporting portion which is formed integrally with the base portion, which projects from the base portion in a form of a cantilever and which is arranged to support a connector, and
a bulging portion which is arranged to receive a component of the control section, which projects from the connector supporting portion and which is connected with the surrounding wall;
wherein the base portion spreads in a first direction along a printed circuit board, the connector supporting portion projects in the first direction continuously from the base portion, from a base end supported by the base portion to a free end, the connector projects in a second direction substantially perpendicular to the first direction, from the connector supporting portion, the bulging portion projects in the second direction from the base portion, and the surrounding wall includes a wall section which projects in the second direction from the connector supporting portion, which confronts the connector across a space formed between the wall section and the connector, and which is connected with the bulging portion;
wherein the bulging portion includes a side wall which projects in the first direction from the wall section of the surrounding wall, which projects in the second direction from the connector supporting portion and which confronts the connector across a space formed between the bulging portion and the connector; and
wherein the covering wall of the bulging portion includes a step.

* * * * *